(12) United States Patent
Manfrini

(10) Patent No.: US 12,137,617 B2
(45) Date of Patent: Nov. 5, 2024

(54) MEMORY CELL WITH MAGNETIC ACCESS SELECTOR APPARATUS

(71) Applicant: Taiwan Semiconductor Manufacturing Company, Ltd., Hsin-Chu (TW)

(72) Inventor: Mauricio Manfrini, Zhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 189 days.

(21) Appl. No.: 17/842,064

(22) Filed: Jun. 16, 2022

(65) Prior Publication Data
US 2022/0310906 A1 Sep. 29, 2022

Related U.S. Application Data

(62) Division of application No. 16/824,862, filed on Mar. 20, 2020, now Pat. No. 11,380,840.

(51) Int. Cl.
*H10N 50/10* (2023.01)
*H10B 61/00* (2023.01)
*H10N 50/80* (2023.01)

(52) U.S. Cl.
CPC ............ *H10N 50/10* (2023.02); *H10B 61/00* (2023.02); *H10N 50/80* (2023.02)

(58) Field of Classification Search
CPC ........ H10N 50/10; H10N 50/80; H10N 50/85; H10B 61/00; H10B 61/10; G11C 11/161; G11C 11/1659
See application file for complete search history.

(56) References Cited

U.S. PATENT DOCUMENTS

| 6,052,263 A | 4/2000 | Gill |
| 6,114,719 A | 9/2000 | Dill et al. |
| 2008/0225581 A1* | 9/2008 | Yamane ............ G11C 11/1659 365/171 |
| 2018/0122825 A1 | 5/2018 | Lupino et al. |

(Continued)

OTHER PUBLICATIONS

Bhatti et al. "Spintronics Based Random Access Memory: A Review" Materials Today, vol. 20, No. 9, Nov. 2017.

(Continued)

*Primary Examiner* — Shih Tsun A Chou
(74) *Attorney, Agent, or Firm* — Eschweiler & Potashnik, LLC

(57) ABSTRACT

An integrated chip has a memory cell that includes a magnetic tunnel junction (MTJ) device and an access selector apparatus. The MTJ device includes a free layer and a pinned layer. The access selector apparatus includes a first metal structure and a second metal structure separated by one or more non-metallic layers. The first metal structure includes a polarized magnetic layer. The polarized magnetic layer produces a magnetic field that extends through the free layer, tilting its magnetic field and thereby substantially reducing a switching time for the MTJ device. The access selector apparatus may be a bipolar selector. The polarized magnetic layer may be incorporated into an electrode of the bipolar selector. Both the access selector apparatus and the MTJ device may be formed by a stack of material layers. The resulting memory cell may be compact and have good write speed.

20 Claims, 12 Drawing Sheets

(56) References Cited

U.S. PATENT DOCUMENTS

| | | |
|---|---|---|
| 2018/0130943 A1 | 5/2018 | Naik et al. |
| 2020/0043536 A1 | 2/2020 | Kuo et al. |
| 2020/0185457 A1 | 6/2020 | Sharma et al. |
| 2020/0227477 A1 | 7/2020 | Majhi et al. |
| 2020/0273513 A1* | 8/2020 | Katayama ........... G11C 11/1675 |

OTHER PUBLICATIONS

Yang et al. "Threshold Switching Selector and 1s1R Integration Development for 3D Cross-Point STT-MRAM." 2017 IEEE International Electron Devices Meeting (IEDM), published on Jan. 25, 2018.

Herner et al. "High Performance MIIM Diode Based on Cobalt Oxide/Titanium Oxide." University of Colorado, Boulder Electrical, Computer & Energy Engineering Faculty Contributions. Published on May 30, 2017.

Lourembam et al. "A Non-Collinear Double MgO Based Perpendicular Magnetic Tunnel." Applied Physics Letters, Jul. 2018.

Non-Final Office Action dated Nov. 15, 2021 for U.S. Appl. No. 16/824,862.

Notice of Allowance dated Mar. 7, 2022 for U.S. Appl. No. 16/824,862.

Samuel Ling et al., University Physics vol. 2, OpenStax, 2018 Rice University, pp. 563-566 (Year: 2018).

* cited by examiner

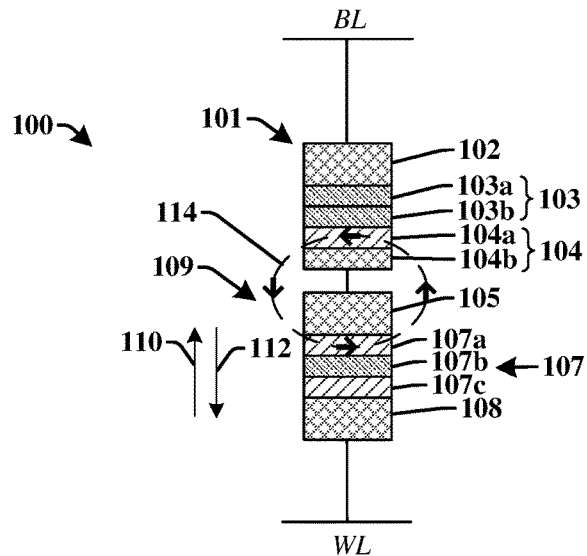
Fig. 1
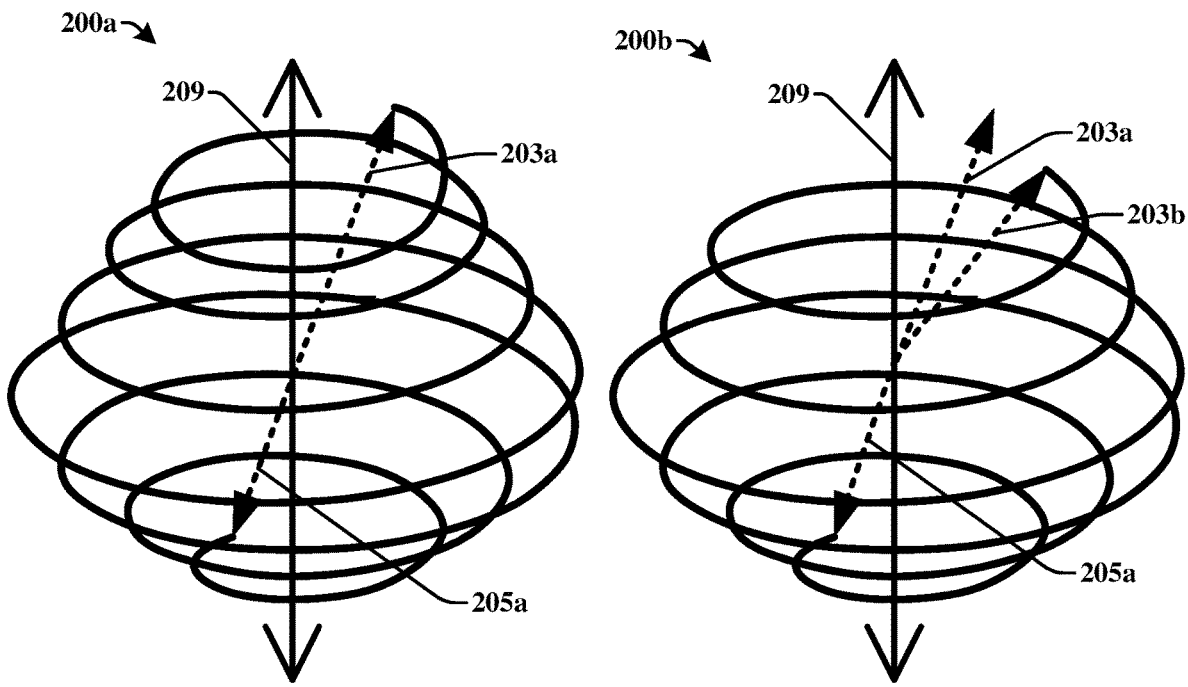
Fig. 2A
Fig. 2B

MEMORY CELL WITH MAGNETIC ACCESS SELECTOR APPARATUS

REFERENCE TO RELATED APPLICATION

This Application is a Divisional of U.S. application Ser. No. 16/824,862, filed on Mar. 20, 2020, the contents of which are hereby incorporated by reference in their entirety.

BACKGROUND

Many electronic devices contain electronic memory configured to store data. Electronic memory may be volatile or non-volatile. Volatile electronic memory uses power to maintain data whereas non-volatile memory is able to store data without power. Magneto-resistive random-access memory (MRAM) is a type of non-volatile memory in which there has long been active interest.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a schematic diagram of a memory circuit having memory cells comprising a magnetic tunnel junction (MTJ) device and an access selector apparatus having a polarized magnetic layer configured to substantially reduce a switching time for the MTJ device in accordance with some embodiments of the present disclosure.

FIG. 2A shows a trace of a magnetic field orientation vector for the free layer of an MTJ device during switching.

FIG. 2B shows another trace of a magnetic field orientation vector for the free layer of an MTJ device during switching, which in comparison to FIG. 2A shows how an initial tilt angle reduces the number of precession cycles in a switching operation.

DETAILED DESCRIPTION

Figure 3A:
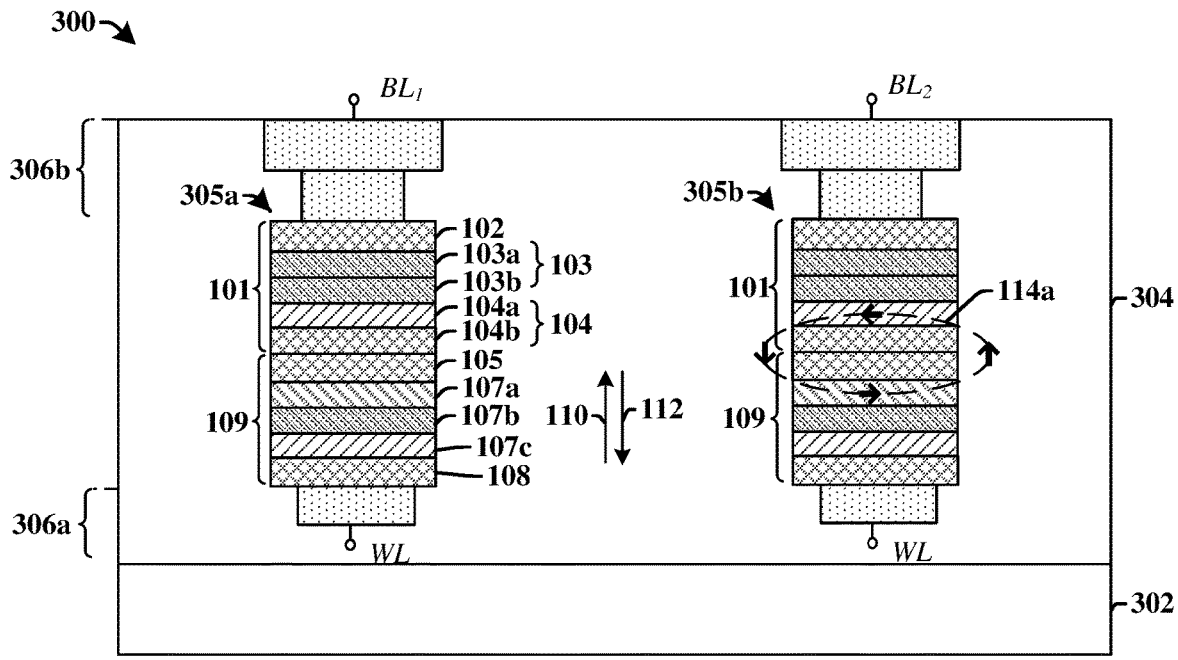
FIGS. 3A-3D illustrate cross-sectional views of some embodiments of integrated circuits according to the present disclosure having memory cells that include an MTJ device and an access selector apparatus having a polarized magnetic layer configured to substantially reduce a switching time for the MTJ device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic tunnel junction (MTJ) devices are a type of MRAM device that comprises an MTJ vertically arranged between conductive electrodes. The MTJ comprises a pinned layer separated from a free layer by a tunnel barrier layer. The pinned layer is magnetic with an orientation that is static (i.e., fixed), while the free layer is magnetic with an orientation that is switchable between a configuration parallel to that of the pinned layer and a configuration anti-parallel to that of the pinned layer to. The parallel configuration provides for a low resistive state that digitally stores data as a first data state (e.g., a logical "1"). The anti-parallel configuration provides for a high resistive state that digitally stores data as a second data state (e.g., a logical "0").

Typically, MTJ devices are arranged within a memory array in rows and columns. A read or write operation is performed on an MTJ device within the memory array by activating word lines and bit lines to provide a voltage and/or current to the selected MTJ device. An access selector apparatus for an MTJ device allows selective flow of current through the selected MTJ device in either of two opposing directions. This is because the orientation of polarization of the free layer in an MTJ device switches between anti-parallel and parallel configurations providing either a high or a low resistive state depending on the direction of the applied current. For example, a current traveling from a bottom electrode to a top electrode may give an MTJ device an anti-parallel configuration resulting in the high resistive state, while a current traveling from the top electrode to the bottom electrode may give the MTJ device the parallel configuration resulting in a low resistive state.

One type of access selector apparatus for MTJ devices is a MOSFET transistor. While a MOSFET transistor offers good performance, the relatively high voltage and/or current that is used during write operations of an MTJ device can cause a size of the MOSFET transistor to be relatively large compared to the MTJ device. The large size of the MOSFET transistor limits how small memory cells within a memory array can be. Another type of access selector apparatus comprises two a unipolar selectors (i.e., devices that each pass current in only a single direction during normal operation). Another type of access selector apparatus is a bipolar selector. A bipolar selector formed by a stack of thin films can have a much smaller size than a MOSFET.

An integrated chip according to the present disclosure has a memory cell that includes a magnetic tunnel junction (MTJ) device and an access selector apparatus. The MTJ device comprises a free layer and a pinned layer. The access selector apparatus includes a first metal structure and a second metal structure separated by one or more non-metallic layers. In accordance with the present teachings, the first metal structure comprises a polarized magnetic layer. Like the pinned layer, the polarized magnetic layer has a magnetic orientation that is static or fixed. The magnetic orientation of the polarized magnetic layer is generally different from that of the pinned layer. In some embodiments, the magnetic orientation of the polarized magnetic layer is nearly orthogonal to that of the pinned layer. The magnetic field produced by the polarized magnetic layer extends through the free layer, tilting its magnetic orientation away from a direction of current flow and thereby substantially reducing a switching time for the MTJ device. In some of these teachings, the access selector apparatus is a bipolar selector. In some of these teachings, the polarized magnetic layer is incorporated into an electrode of the bipolar selector. In some of these teachings, the bipolar selector includes a dielectric layer formed by oxidizing a portion of the polarized magnetic layer. Forming the dielectric layer by oxidizing the polarized magnetic layer results in a simplified process and facilitates integrating the bipolar selector with the MTJ device. In some of these teachings, both the access selector apparatus and the MTJ device are formed by a stack of material layers. A memory cell in an integrated chip according to the present teachings may be efficiently manufactured, may be compact, and may have good write speed.

FIG. 1 illustrates a schematic diagram of a memory cell 100 according to some embodiments of the present disclosure having an access selector apparatus 101 and a magnetic tunnel junction (MTJ) device 109. The access selector apparatus 101 includes a polarized magnetic layer 104a configured to substantially reduce a switching time for the MTJ device.

The MTJ device 109 includes an MTJ 107 disposed between a first electrode 108 and a second electrode 105. The first electrode 108 is coupled to a word-line WL and the second electrode 105 is coupled to an access selector apparatus 101 that modulates access (e.g., read access and/or write access) to the MTJ device 109. The access selector apparatus 101 is further coupled to a bit-line BL. In some embodiments, the access selector apparatus 101 is positioned between the BL and the MTJ device 109. In some alternative embodiments, the access selector apparatus 101 is positioned between the WL and the MTJ device 109.

In some embodiments, the MTJ 107 comprises a pinned layer 107c separated from a free layer 107a by a dielectric tunnel barrier 107b. The pinned layer 107c has a magnetic polarization that is fixed, while the free layer 107a has a magnetic polarization that can be changed by a switching operation to be either parallel (i.e., a 'P' state) or anti-parallel (i.e., an 'AP' state) with respect to the magnetic polarization of the pinned layer 107c. The switching operation may operate through the tunnel magnetoresistance (TMR) effect. A relationship between the magnetic polarizations of the pinned layer 107c and the free layer 107a defines a resistive state of the MTJ 107 and thereby enables the MTJ 107 to store a data state.

In some embodiments, the polarization of the pinned layer 107c is perpendicular (in a first direction 110 or a second direction 112). In some embodiments, the pinned layer 107c comprises cobalt (Co), iron (Fe), boron (B), nickel (Ni), ruthenium (Ru), iridium (Ir), platinum (Pt), or the like. In some embodiments, the dielectric tunnel barrier 107b comprises magnesium oxide (MgO), aluminum oxide ($Al_2O_3$), or the like. In some embodiments, the free layer 107a comprises cobalt (Co), iron (Fe), boron (B), or the like. In some embodiments, the first electrode 108 and the second electrode 105 comprise one or more of titanium, tantalum, tungsten, titanium nitride, tantalum nitride, or the like.

The access selector apparatus 101 may be a bipolar selector that includes a first electrode 104, which is a metal structure, and a second electrode 102, which is another metal structure, separated by a non-metal structure 103. The non-metal structure 103 may be one or more layers of suitable insulators and or semiconductors. In some embodiments, the non-metal structure 103 includes an insulator that is an oxide of a ferromagnetic metal such an oxide of cobalt ($CoO_x$), an oxide of nickel ($NiO_x$), an oxide of iron ($FeO_x$), or the like. In some embodiments, non-metal structure 103 includes an insulator that is an intrinsic oxide such as an oxide of hafnium oxide ($HfO_2$), titanium oxide ($TiO_2$), aluminum oxide ($Al_2O_3$), or the like. In some embodiments, the non-metal structure 103 includes one layer that is an insulator and access selector apparatus 101 is a metal-insulator-metal (MIM) bipolar selector. In some embodiments, the non-metal structure 103 includes a first insulator 103a and a second insulator 103b and the access selector apparatus 101 is an (MIIM) bipolar selector. In some embodiments the first insulator 103a has a first band gap energy and the second insulator 103b has a second band gap energy that is different from the first band gap energy. In some of these embodiments, the first insulator 103a is titanium oxide ($TiO_2$) or the like. In some of these embodiments, the second insulator 103b is an oxide of a magnetic metal. In some of these embodiments, the oxide of a magnetic metal is an oxide of cobalt ($CoO_x$), an oxide of iron ($FeO_x$), an oxide of nickel ($NiO_x$), or the like. For example, the oxide of a magnetic metal may be $Co_3O_4$.

In some embodiments, the non-metal structure 103 includes one layer that is a semiconductor and the access selector apparatus 101 is a metal-semiconductor-metal (MSM) bipolar selector. Suitable semiconductors for the access selector apparatus 101 may include silicon (Si), germanium (Ge), silicon germanium (SiGe), oxide semiconductors such as indium gallium zinc oxide (IGZO), Group III-V materials such as indium gallium arsenide (InGaAS), or the like. In some embodiments, the non-metal structure 103 includes a plurality of semiconductor layers. In some embodiments, the non-metal structure 103 includes a mixture of insulator and semiconductor layers. Multiple layers of differing materials may facilitate providing the desired rectification characteristics for the access selector apparatus 101.

During operation, the access selector apparatus 101 allows currents driven by comparatively large voltage differences to pass with relatively little resistance. The current may proceed through the MTJ device 109 in either the first direction 110 (e.g., from the word-line WL to the bit-line BL) or the second direction 112, which is opposite the first direction 110 (e.g., from the bit-line BL to the word-line WL). Current passing through the MTJ device 109 along the first direction 110 is used to write a first data state (e.g., a logical "0") to the MTJ device 109. Current passing through the MTJ device 109 along the second direction 112 is used to write a second data state (e.g., a logical "1") to the MTJ device 109. The access selector apparatus 101 presents a significantly greater resistance to currents driven by smaller voltage differences. Thus, access selector apparatus 101 reduces leak currents through the MTJ device 109 when the memory cell 100 is not selected.

The first electrode 104 and the second electrode 102 of the access selector apparatus 101 may comprise one or more metals such as titanium (Ti), tantalum (Ta), tungsten (W), titanium nitride (TiN), tantalum nitride (TaN), cobalt (Co), copper (Cu). In accordance with some aspects of the present teachings, one of the first electrode 104 and the second electrode 102 comprise a polarized magnetic layer. The polarized magnetic layer may be a ferromagnetic layer. A ferromagnetic layer may be cobalt (Co), iron (Fe), nickel (Ni), or the like, or an alloy such as cobalt iron boron (CoFeB) or the like, or a multilayer ferromagnetic structure such as cobalt iron/nickel iron (CoFe/NiFe) or the like. In some embodiments, the polarized magnetic layer has in plane polarization, which is a polarization perpendicular to both the first direction 110 and the second direction 112. In some embodiments, one of the first electrode 104 and the second electrode 102 of the access selector apparatus 101 includes a polarized ferromagnetic layer and a metal. For example, the first electrode 104 may include the polarized magnetic layer 104a and a non-magnetic layer 104b that is a metal. In a more particular example, the polarized magnetic layer 104a may be cobalt (Co) or the like and the non-magnetic layer 104b may be titanium (Ti) or the like.

The polarized magnetic layer 104a produces a magnetic field 114 that is operative to tilt a magnetic field in the free layer 107a away from a direction of current flow thereby reduces a write time (switching time) for the MTJ device 109. FIGS. 2A and 2B explain this effect. As shown by plot 200a of FIG. 2A, a direction of polarization 201a for a magnetic field of free layer 107a does not move on a direct path as it transitions from a first direction 203a to a second direction 205a, but precesses about an axis 209 to trace a spiral. The axis 209 of this spiral is oriented in the direction of current flow, which may be the first direction 110 or the second direction 112. The time for the precession to take place is referred to as an incubation period for a write operation. For example, the incubation period may be in the range from about 5 nanoseconds to about 10 nanoseconds. As shown by plot 200b of FIG. 2B, if the starting direction of polarization is tilted a small amount away from the axis 209 to the direction 203b, the number of precessions and, consequently, the incubation period, can be significantly reduced.

In fact, absent the polarized magnetic layer 104a, the magnetic field of the free layer 107a is approximately parallel to the axis 209 and initially moves away from the axis 209 very slowly and with many precessions. The polarized magnetic layer 104a causes the magnetic field of the free layer 107a to be initially tilted, which may greatly reduce the incubation time. In some embodiments, the polarized magnetic layer 104a tilts the magnetic field of the free layer 107a from about one degree to about five degrees. In some embodiments, the polarized magnetic layer 104a tilts the magnetic field of the free layer 107a sufficiently to reduce the incubation time by half or more. In some embodiments, the tilt reduces the incubation time by a factor of eight or more. A small tilt may be sufficient to achieve these results.

FIGS. 3A-3D illustrate cross-sectional views 300, 320, 340, and 360 of integrated chips according to various embodiments of the present disclosure, each featuring a memory cell that includes an MTJ device and an access selector apparatus having a middle structure disposed between two metal structures one of which includes a polarized magnetic layer that produces a magnetic field effective to reduce a number of precession cycles undergone by a free layer of the MTJ device during switching.

FIG. 3A illustrates a cross-sectional view 300 of an integrated chip having a dielectric structure 304 arranged over a substrate 302. The dielectric structure 304 comprises a plurality of stacked inter-level dielectric (ILD) layers and surrounds a first memory cell 305a and a second memory cell 305b, which is laterally adjacent to the first memory cell 305a. The first memory cell 305a and the second memory cell 305b each comprise an access selector apparatus 101 and an MTJ device 109 that is configured to store a data state. Within each of the first memory cell 305a and the second memory cell 305b both the access selector apparatus 101 and the MTJ device 109 are formed by a single vertical stack of thin films or layers. The access selector apparatus 101 is a bipolar selector that includes a polarized magnetic layer 104a that generates a magnetic field 114a that is effective to tilt the polarization of the free layer 107a away from the direction of current flow (either the first direction 110 or the second direction 112). This effect may occur regardless of whether the free layer 107a is in the parallel or the anti-parallel configuration. The non-magnetic layer 104b of the first electrode 104 is adjacent to the second electrode 105 of the MTJ device 109. These adjacent layers may be formed by a single layer of one material.

The dielectric structure 304 further surrounds a plurality of metal interconnect layers including an interconnect layer 306a and an interconnect layers 306b, which are adjacent. The first memory cell 305a and the second memory cell 305b are disposed between the interconnect layers 306a and 306b. The interconnect layers 306a and 306b may comprise interconnect wires and interconnect vias. The interconnect wires and the interconnect vias comprise a conductive material (e.g., copper, aluminum, tungsten, or the like). The interconnect wires and the interconnect vias may further comprise a diffusion barrier layer and/or a glue layer surrounding the conductive material.

Figure 3B:
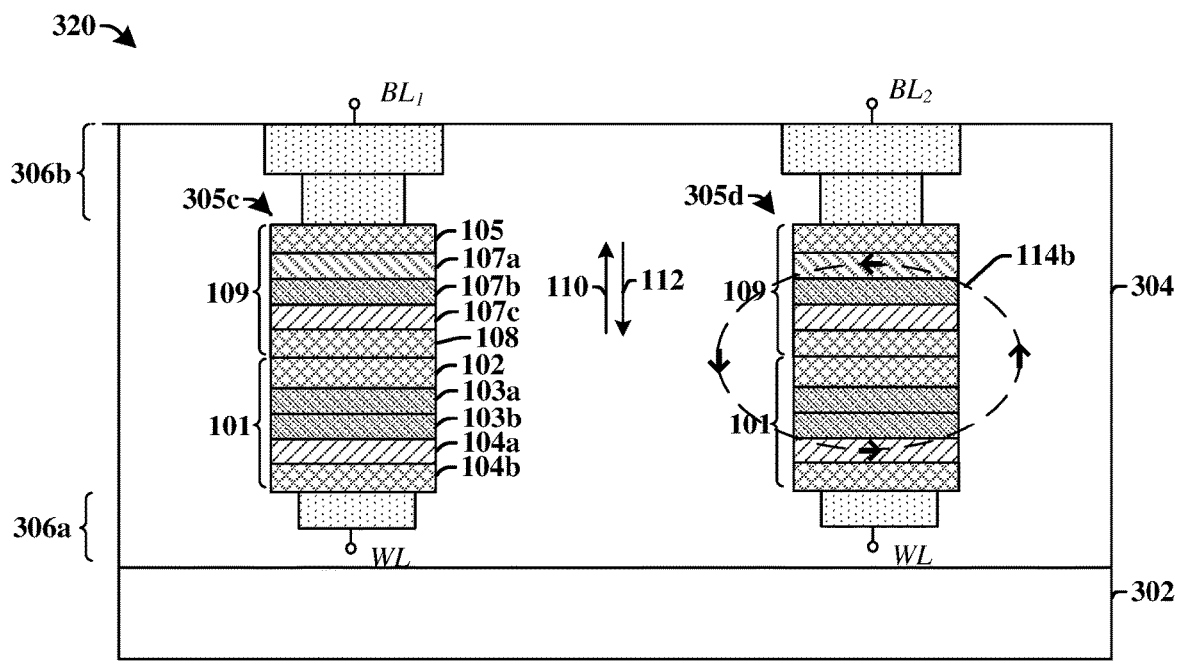

FIG. 3B illustrates a cross-sectional view 320 of an integrated chip according to some other embodiments of the present disclosure. In the cross-sectional view 320, a first memory cell 305c and a second memory cell 305d are disposed within the dielectric structure 304. Each includes the access selector apparatus 101 and the MTJ device 109. The polarized magnetic layer 104a of the access selector apparatus 101 generates a magnetic field 114b that is effective to tilt the polarization of the free layer 107a away from a direction of current flow whether the free layer 107a is in the parallel or the anti-parallel configuration. The first memory cell 305c and the second memory cell 305d differ from the first memory cell 305a and the second memory cell 305b of the cross-sectional view 300 of FIG. 3A in that the MTJ device 109 is disposed above the access selector apparatus 101. In the device illustrated by the cross-sectional view 320, the second electrode 102 of the MTJ device 109 is adjacent to the first electrode 108 of the access selector apparatus 101. These electrodes may be formed by a single layer of one material. Put another way, a top electrode for the one device may provide a bottom electrode for the other device.

As illustrated by a comparison of the cross-sectional view 300 and the cross-sectional view 320, the layers of the access selector apparatus 101 may be formed either on top of the layers of the MTJ device 109 or underneath the layers of the MTJ device 109. The polarized magnetic layer 104a of the access selector apparatus 101 may be on the MTJ device 109 side of the non-metal structure 103 or on the opposite side. The free layer 107a of the MTJ device 109 may be closer to the access selector apparatus 101 than the pinned layer 107c or further. Notwithstanding these alternatives, the effectiveness of the polarized magnetic layer 104a for increasing write speed may increase as the polarized magnetic layer 104a is placed closer to the free layer 107a.

Figure 3C:
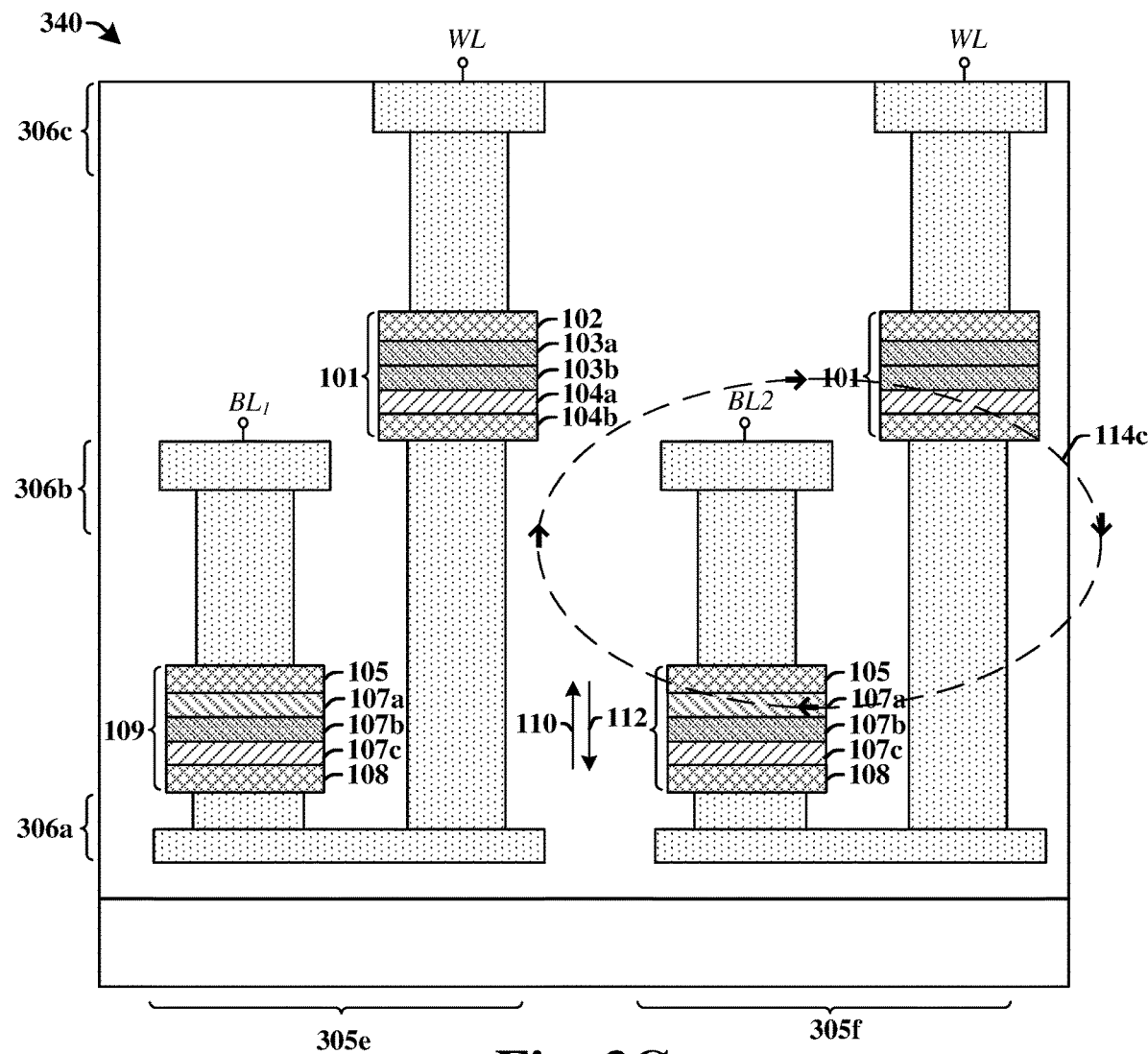

FIG. 3C illustrates a cross-sectional view 340 of another integrated chip having laterally disposed memory cells 305e and 305f, each comprising the MTJ device 109 and the access selector apparatus 101. The access selector apparatus 101 may be laterally offset from the MTJ device 109 in each of the memory cells 305e and 305f. Moreover, whereas the MTJ device 109 is disposed between interconnect layers 306a and 306b, in this embodiment the access selector apparatus 101 is disposed between interconnect layers 306b and 306c. The access selector apparatus 101 is a bipolar selector that includes a polarized magnetic layer 104a that generates a magnetic field 114c that is effective to tilt the polarization of the free layer 107a away from the direction of current flow (either the first direction 110 or the second direction 112).

Figure 3D:
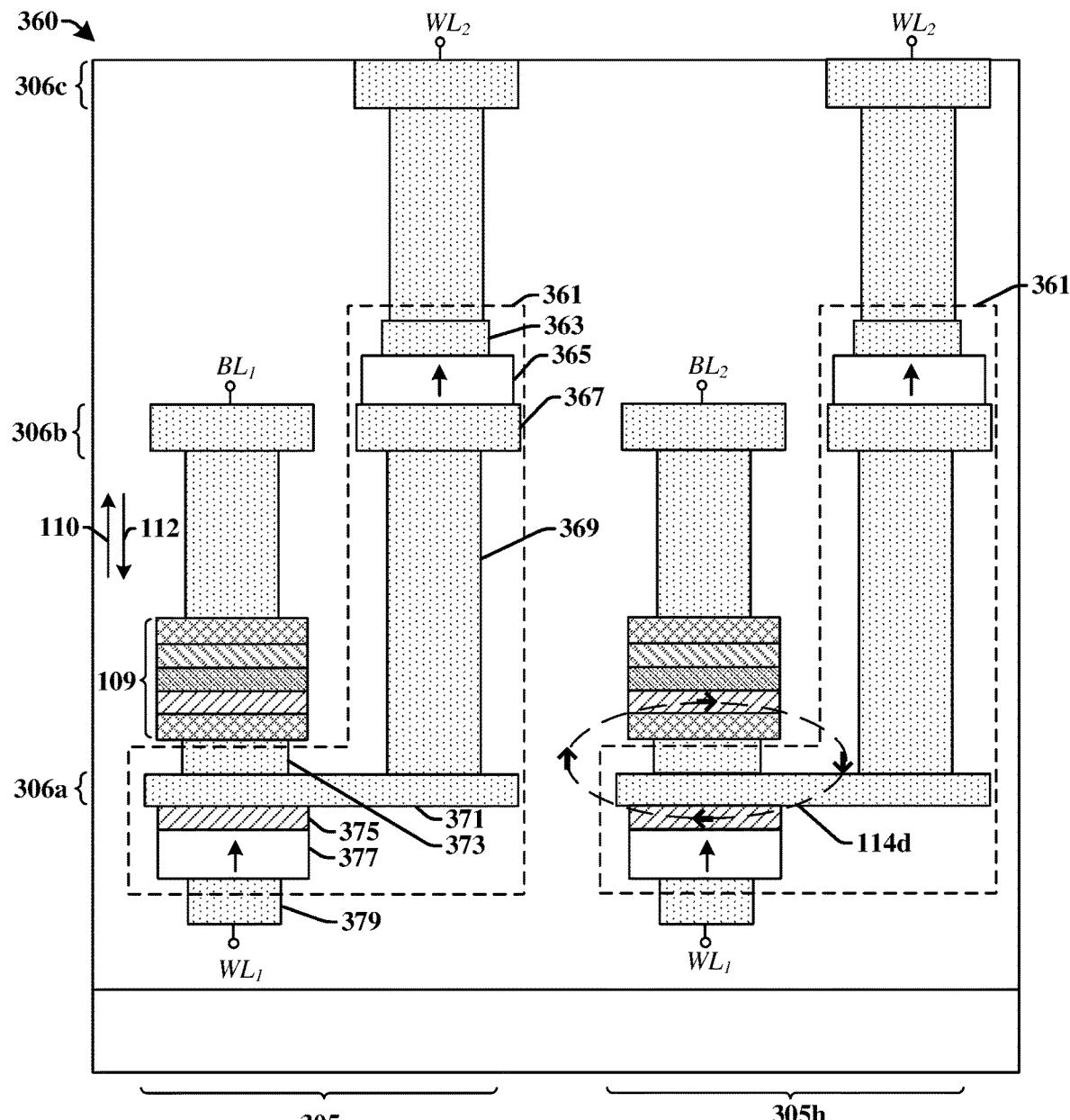

FIG. 3D illustrates a cross-sectional view 360 of another integrated chip having laterally disposed memory cells 305g and 305h, each comprising the MTJ device 109 and an access selector apparatus 361. The access selector apparatus 361 includes a first unipolar selector 377 and a second unipolar selector 365. The first unipolar selector 377 and the second unipolar selector 365 are respectively configured to allow current to pass along a single direction during normal operation (e.g., outside of breakdown). For example, the first unipolar selector 377 is configured to allow current to pass through the MTJ device 109 along the first direction 110 (e.g., from the first word line $WL_1$ to the bit line $BL_1$) and the second unipolar selector 365 is configured to allow current to pass through the MTJ device 109 along a second direction 112 that is opposite the first direction 110 (e.g., from the bit line $BL_1$ to the second word line $WL_2$). When current passes through the MTJ device 109 along the first direction 110, a first data state (e.g., a logical "0") may be written to the MTJ device 109. When current passes through the MTJ device 109 along the second direction 112, a second data state (e.g., a logical "1") may be written to the MTJ device 109.

In some embodiments, the first unipolar selector 377 and the second unipolar selector 365 are diodes (e.g., PN diodes, PiN diodes, Schottky diodes, oxide semiconductor-oxide diodes, or the like). In such embodiments, MTJ device 109 is accessed for read and write operations using applied voltage differences greater than a threshold value of the diodes. In other embodiments, one or both of the first unipolar selector 377 and the second unipolar selector 365 are filament based selectors, rectifiers, varistor-type selectors, ovonic threshold switches (OTSs), doped-chalcogenide-based selectors, Mott effect based selectors, mixed-ionic-electronic-conductive (MIEC)-based selectors, field-assisted-superliner-threshold (FAST) selectors, or the like. In some embodiments, the first unipolar selector 377 and the second unipolar selector 365 are the same type of unipolar selector. In other embodiments, the first unipolar selector 377 and the second unipolar selector 365 are different types of unipolar selectors. For example, in some embodiments, the first unipolar selector 377 may be a diode and the second unipolar selector may be a filament-based selector.

An electrode for the first unipolar selector 377 includes an electrode having a magnetic layer 375 that generates a magnetic field 114d that is effective to tilt the polarization of the free layer 107a away from the direction of current flow (either the first direction 110 or the second direction 112) and thereby reduce an incubation period for writing MTJ device 109. In other embodiments, the magnetic layer 375 is disposed elsewhere within the access selector apparatus 361. For example, the magnetic layer 375 may be all or part of a bottom electrode 379 of the first unipolar selector 377, a crossbar 371, a via 373 that connects MTJ device 109 to the crossbar 371, a via 369 that connects the second unipolar selector 365 to the crossbar 371, a bottom electrode 367 for the second unipolar selector 365, or a top electrode 363 for the second unipolar selector 365.

Figure 4:
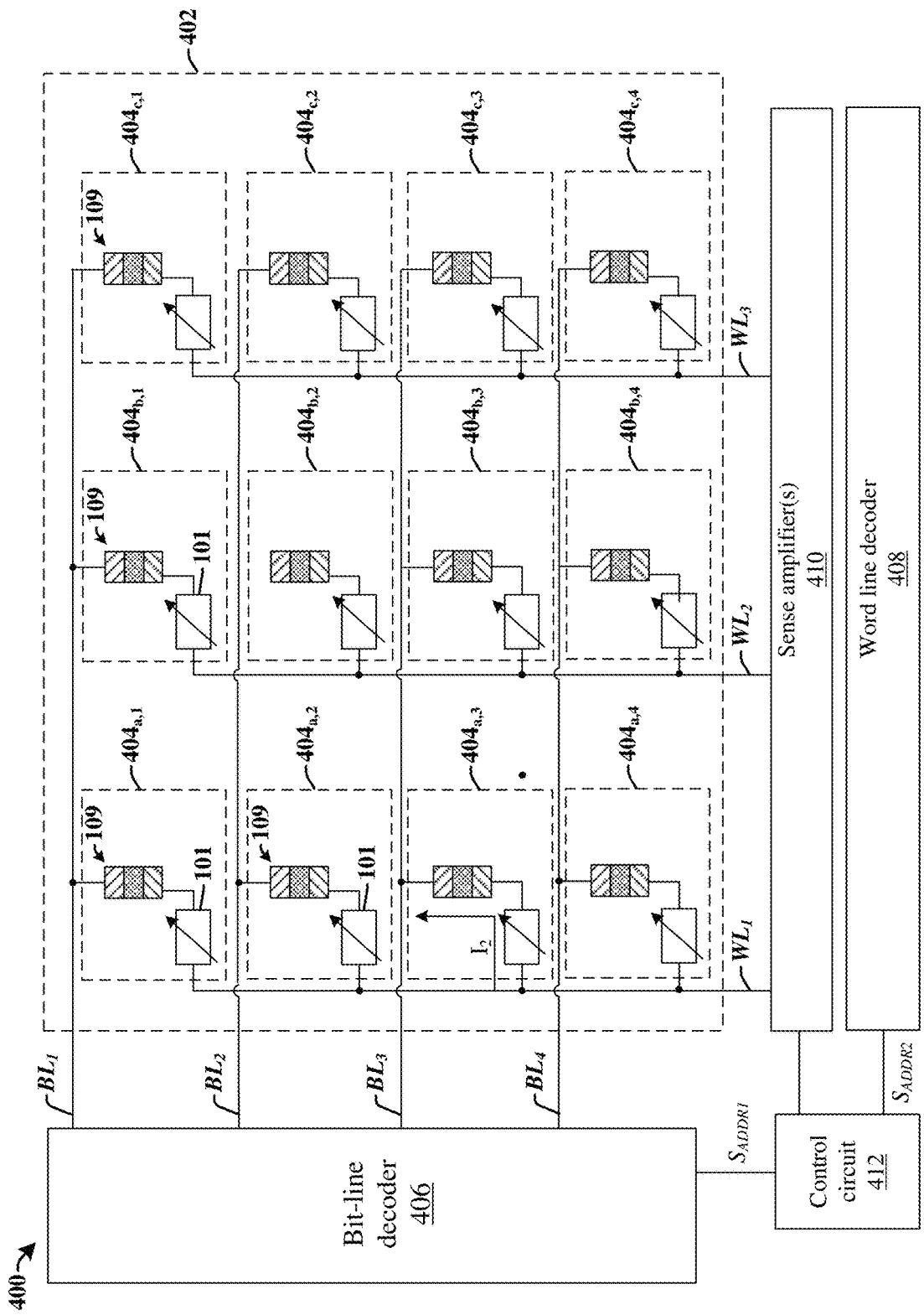
FIG. 4 illustrates a block diagram of a memory circuit comprising a memory array having a plurality of memory cells each including an access selector apparatus comprising a bipolar selector.

FIG. 4 illustrates a block diagram of some embodiments of a memory circuit 400 comprising a memory array having a plurality of memory cells respectively including an access selector apparatus with a plurality of bipolar selectors.

The memory circuit 400 comprises a memory array 402 having a plurality of memory cells $404_{a,1}$-$404_{c,4}$. The plurality of memory cells $404_{a,1}$-$404_{c,4}$ are arranged within the memory array 402 in rows and/or columns. For example, a first row of memory cells comprises memory cells $404_{a,1}$-$404_{c,1}$, while a first column of memory cells comprises memory cells $404_{a,1}$-$404_{a,4}$. The plurality of memory cells $404_{a,1}$-$404_{c,4}$ each comprises an MTJ device 109 coupled to an access selector apparatus 101 having a polarized magnetic layer 104a that reduces write times for the respective MTJ device 109. The access selector apparatus 101 is configured to selectively provide access to an MTJ device 109 within one or more of the plurality of memory cells $404_{a,1}$-$404_{c,4}$ by allowing current to flow through the selected memory cells $404_{a,1}$-$404_{c,4}$ while inhibiting leakage currents through non-selected memory cells $404_{a,1}$-$404_{c,4}$.

The memory array 402 is coupled to control circuitry by way of a plurality of bit lines $BL_1$-$BL_4$ and a plurality of word-lines $WL_1$-$WL_3$. In some embodiments, the control circuitry comprises a bit line decoder 406 coupled to the plurality of bit-lines $BL_1$-$BL_4$ and a word line decoder 408 coupled to the plurality of word-lines $WL_1$-$WL_3$. In some embodiments, the control circuitry may further comprise a sense amplifier 410 coupled to the memory array 402 by way of a plurality of word lines $WL_1$-$WL_3$. The sense amplifier 410 is configured to read data from the plurality of memory cells $404_{a,1}$-$404_{c,4}$.

To access the MTJ device 109 of a memory cell $404_{a,1}$-$404_{c,4}$, the bit line decoder 406 is configured to selectively apply a first voltage to one or more of the bit lines $BL_1$-$BL_4$ based upon a first address $S_{ADDR1}$ received from a control circuit 412, while the word line decoder 408 is configured to selectively apply a second voltage to one or more of the word lines $WL_1$-$WL_3$ based upon a second address $S_{ADDR2}$ received from the control circuit 412. The applied voltages will cause a current to flow through the access selector apparatus 101 and the MTJ device 109 of the selected memory cell $404_{a,1}$-$404_{c,4}$.

Figure 5:
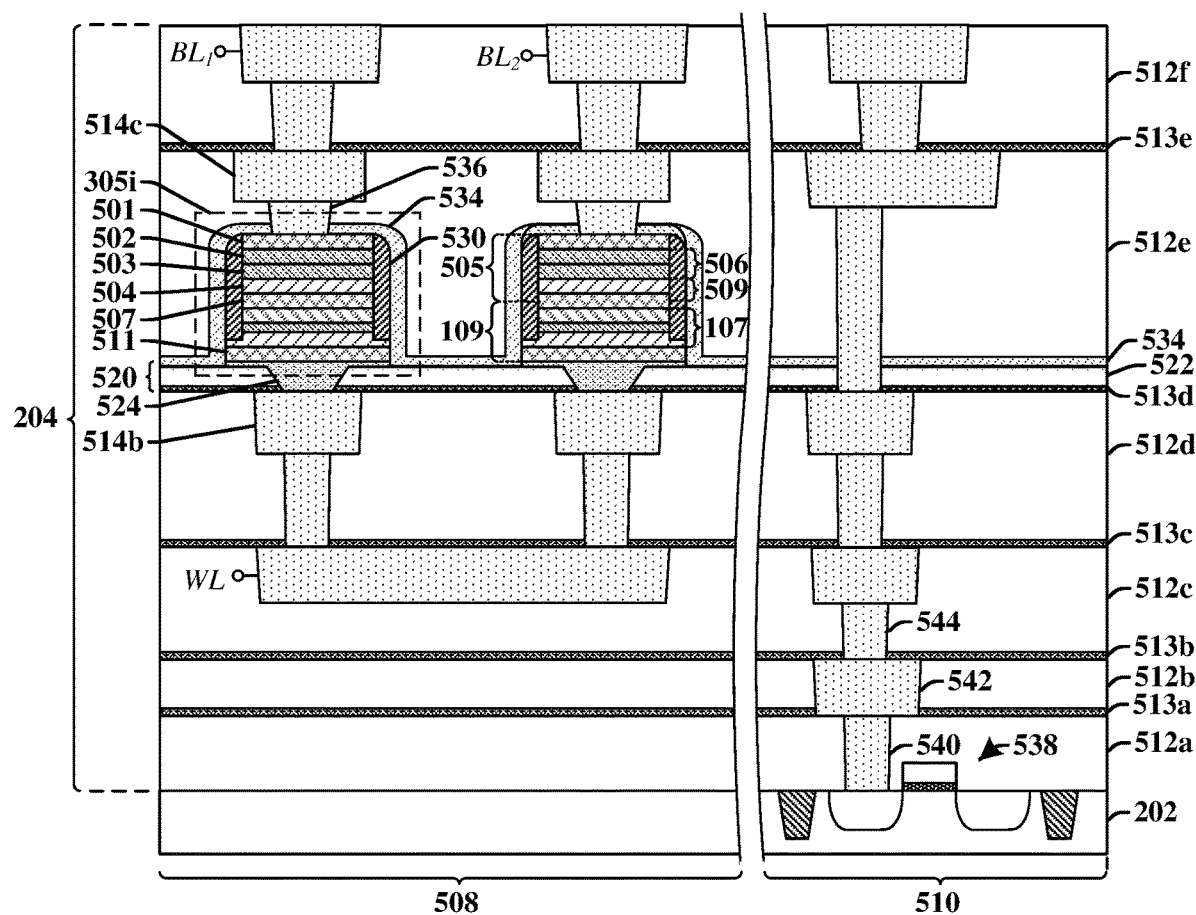
FIG. 5 illustrates a cross-sectional view of some embodiments of an integrated chip having memory cells comprising a magnetic tunnel junction (MTJ) device and an access selector apparatus having a polarized magnetic layer configured to substantially reduce a switching time for the MTJ device.

FIG. 5 illustrates a cross-sectional view of an integrated chip 500 according to some other aspects of the present teachings having a memory array that includes a plurality of memory cells, each of which includes an MTJ device and an access selector apparatus having a polarized magnetic layer that reduces a write time for the MTJ. The polarized magnetic layer of any one of the memory cells may also contribute to a reduction in write time for the MTJs of one or more adjacent cells. The integrated chip 500 may be modified to incorporate the concepts described in relation to any of cross-sectional view 300 of FIG. 3A, cross-sectional view 320 of FIG. 3B, cross-sectional view 340 of FIG. 3C, and cross-sectional view 360 of FIG. 3D.

The integrated chip 500 comprises a substrate 202 including an embedded memory region 508 and a logic region 510. A dielectric structure 204 is arranged over the substrate 202. The dielectric structure 204 comprises a plurality of stacked inter-level dielectric (ILD) layers 512a-512f vertically separated by etch stop layers 513a-513e. In some embodiments, the plurality of stacked ILD layers 512a-512f comprise one or more of silicon dioxide, SiCOH, a fluorosilicate glass, a phosphate glass (e.g., borophosphate silicate glass,), or the like. In some embodiments, the etch stop layers 513a-513e comprise a nitride (e.g., silicon nitride), a carbide (e.g., silicon carbide), or the like.

Disposed within the embedded memory region 508 are a plurality of memory cells 305i each of which includes an access selector apparatus 505 coupled to an MTJ device 109. The access selector apparatus 505 includes a first metal structure 509 and a top electrode 501 separated by one or more non-metallic layers 506. The first metal structure 509 comprises a polarized magnetic layer 504 with in-plane polarization. In some embodiments, the one or more non-metallic layers 506 include a first dielectric layer 503 that is adjacent to the polarized magnetic layer 504 and is an oxidation product of the polarized magnetic layer 504. In some embodiments, the one or more non-metallic layers 506 further comprise a second dielectric layer 502 having a different band gap energy from the first dielectric layer 503. In some embodiments, the access selector apparatus 505 is a bipolar selector.

The MTJ device 109 has an MTJ 107 disposed between a first electrode 511 and a second electrode 507. In some embodiments, sidewall spacers 530 are disposed along opposing sides of the MTJ 107. In some embodiments, the sidewall spacers 530 extend to flank the sidewalls of access selector apparatus 505. The sidewalls spacers 530 may have curved outermost sidewalls facing away from the MTJ 107. In various embodiments, the sidewalls spacers 530 comprise silicon nitride, silicon dioxide ($SiO_2$), silicon oxy-nitride (e.g., SiON), or the like. In some embodiments, an encapsulation layer 534 is disposed over the sidewall spacers 530. In some embodiments, the encapsulation layer 534 comprises an oxide (e.g., silicon rich oxide), a nitride (e.g., silicon nitride), a carbide (e.g., silicon carbide), or the like.

In some embodiments, a top electrode via 536 extends through the encapsulation layer 534 to contact the top electrode 501 of the memory cell 305i. The top electrode via 536 couples the second electrode 105 to an interconnect wire 514c. In some embodiments, the top electrode via 536 comprises aluminum, copper, tungsten, or the like. In some embodiments, a second interconnect wire 514b is disposed beneath the memory cell 305i and is separated from the memory cell 305i by a lower insulating structure 520 and the fourth etch stop layer 513d. A bottom electrode via 524 may extend through the lower insulating structure 520 to couple the first electrode 511 to the second interconnect wire 514b.

The lower insulating structure 520 may comprise one or more layers of various insulators. In some embodiments, the lower insulating structure 520 comprises a silicon rich oxide layer or the like. In some embodiments, the lower insulating structure 520 has a greater (i.e., larger) thickness in the logic region 510 than in the embedded memory region 508. In some embodiments, the lower insulating structure 520 includes a layer of silicon carbide, silicon nitride, or the like. In some embodiments, the lower insulating structure 520 includes the encapsulation layer 534. In some embodiments, the lower insulating structure 520 includes a layer of tetraethyl orthosilicate (TEOS) or the like.

In some embodiments, the second interconnect wire 514b is coupled to a word line WL. Alternatively, the second interconnect wire 514b may be a word line. In some embodiments, the second interconnect wire 514c is coupled to a bit line $BL_1$ or $BL_2$. In some embodiments, the second interconnect wire 514c itself provides the bit line. The memory cell 305i is formed within the fifth ILD layer 512e. Alternatively, the memory cell 305i may be formed within another ILD layer above or below the fifth ILD layer 512.

Within the logic region 510, one or more additional interconnect layers are disposed within the dielectric structure 204. The one or more additional interconnect layers comprise a conductive contact 540, an interconnect wire 542, and an interconnect via 544. The one or more additional interconnect layers are coupled to a logic device 538 arranged within the substrate 202. In some embodiments, the logic device 538 may comprise a transistor device (e.g., a MOSFET, a bipolar junction transistor (BJT), a high electron mobility transistor (HEMT), or the like).

FIGS. 6-14 show cross-sectional views 600-1400 illustrating a method of forming an integrated chip having an access selector apparatus comprising a bipolar selector that includes a polarized magnetic layer operative to reduce a write time for an associated MTJ device in accordance with some embodiments of the present disclosure. Although FIGS. 6-14 are described in relation to a method, it will be appreciated that the structures disclosed in FIGS. 6-14 are not limited to such a method, but instead may stand alone as structures independent of the method. Furthermore, although FIGS. 6-14 illustrate particular structures and compositions for the MTJ device and the access selector apparatus, the method is readily extendable to other structures and compositions within the scope of this disclosure.

Figure 6:
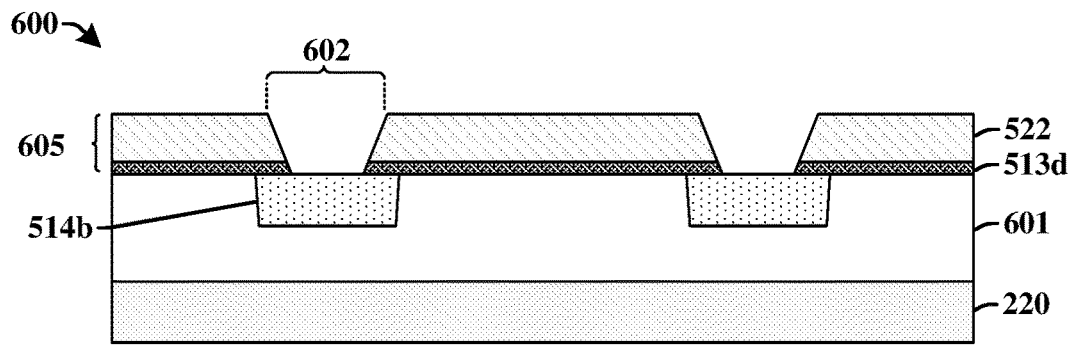
FIGS. 6-14 illustrate some embodiments of a method of forming an integrated chip having memory cells comprising a magnetic tunnel junction (MTJ) device and an access selector apparatus having a polarized magnetic layer configured to substantially reduce a switching time for the MTJ device.

As shown in cross-sectional view 600 of FIG. 6, a lower insulating structure 605 is formed over a metal interconnect structure 601 that is itself formed over substrate 220. In various embodiments, the substrate 202 may be any type of semiconductor body (e.g., silicon, SiGe, SOI), such as a semiconductor wafer and/or one or more die on a wafer, as well as any other type of semiconductor and/or epitaxial layers, associated therewith. Metal interconnect structure 601 may comprise one or more ILD layers separated by etch stop layers and surrounding conductive wires, vias, and the like. The ILD layers may comprise one or more dielectric materials, such as silicon dioxide ($SiO_2$), SiCOH, a fluorosilicate glass, a phosphate glass (e.g., borophosphate silicate glass), or the like. The conductive material forming wires, vias, and the like within metal interconnect structure 601 may comprise a metal (e.g., aluminum, copper, tungsten) formed by way of a deposition process (e.g., CVD, PVD, PE-CVD, ALD).

In some embodiments, the lower insulating structure 605 is formed and then selectively patterned to define bottom electrode via openings 602 over interconnect wires 514b or like conductive features within metal interconnect structure 601. In some embodiments, the lower insulating structure 605 comprises a fourth etch stop layer 513d or some other etch stop layer and a first dielectric layer 522 disposed over that etch stop layer. The first dielectric layer 522 may comprise one or more of silicon carbide, silicon rich oxide, TEOS (tetraethyl orthosilicate), or the like.

Figure 7:
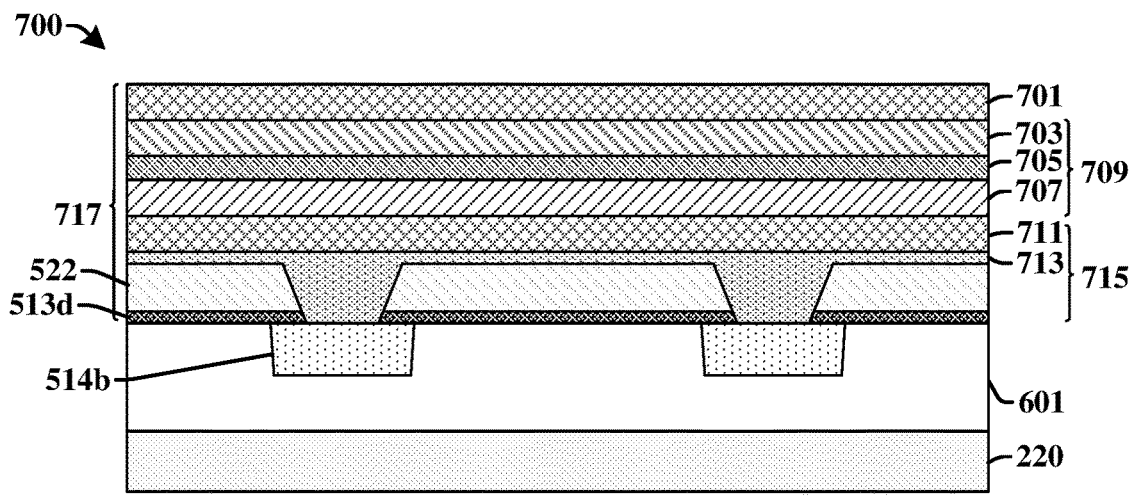

As shown in cross-sectional view 700 of FIG. 7, an MTJ device stack 717 may be formed over the lower insulating structure 605. The MTJ device stack 717 may include a bottom electrode structure 715, an MTJ stack 709, and a top electrode layer 701. In some embodiments, the bottom electrode structure 715 includes a bottom electrode layer 711 overlying a bottom electrode via layer 713. The bottom electrode via layer 713 may overlie the lower insulating structure 605 and fill the opening 602. The MTJ stack 709 may include a pinned layer 707, a dielectric barrier tunnel layer 705, and a free layer 703. In some embodiments, the pinned layer 707 is disposed between the free layer 703 and the bottom electrode structure 715. In other embodiments (not shown), the free layer 703 is disposed between the pinned layer 707 and the bottom electrode structure 715. The top electrode layer 701 is formed over the MTJ stack 709.

Figure 8:
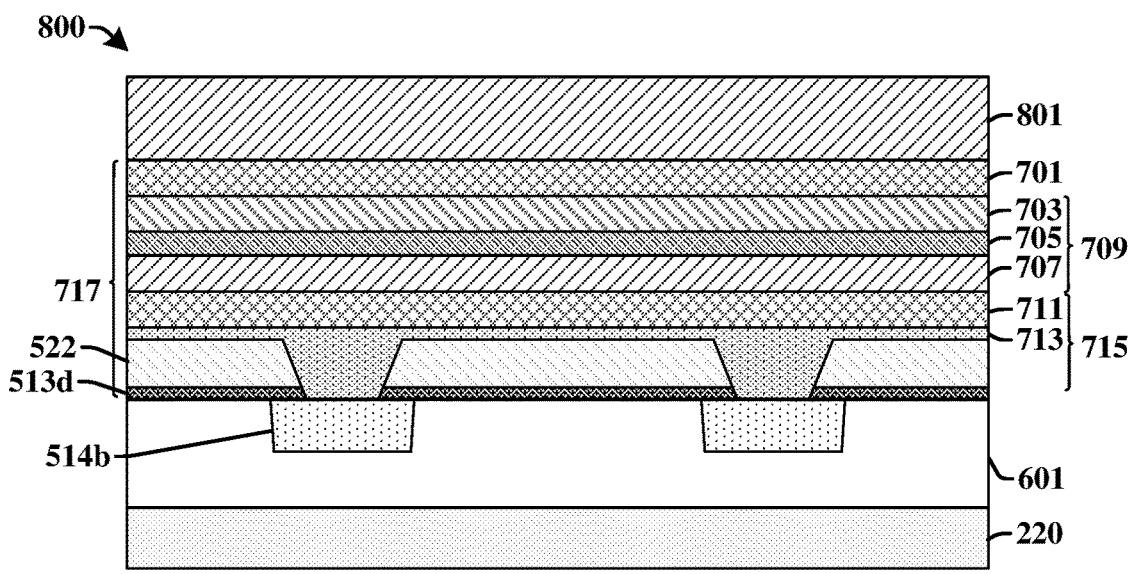

As shown in cross-sectional view 800 of FIG. 8, a ferromagnetic layer 801 may be deposited over the MTJ device stack 717. In some embodiments, the thickness of the ferromagnetic layer 801 is between approximately 5 nm and approximately 200 nm. In some embodiments, the thickness of the ferromagnetic layer 801 is between approximately 15 nm and approximately 50 nm. In some embodiments, the ferromagnetic layer 801 is formed with polarization using a crystal growth process or the like. In other embodiments, the ferromagnetic layer 801 is polarized after formation. In some embodiments, the ferromagnetic layer 801 has a high coercivity to facilitate making it a static layer that maintains its polarization throughout the lifetime of any resulting device.

Figure 9:
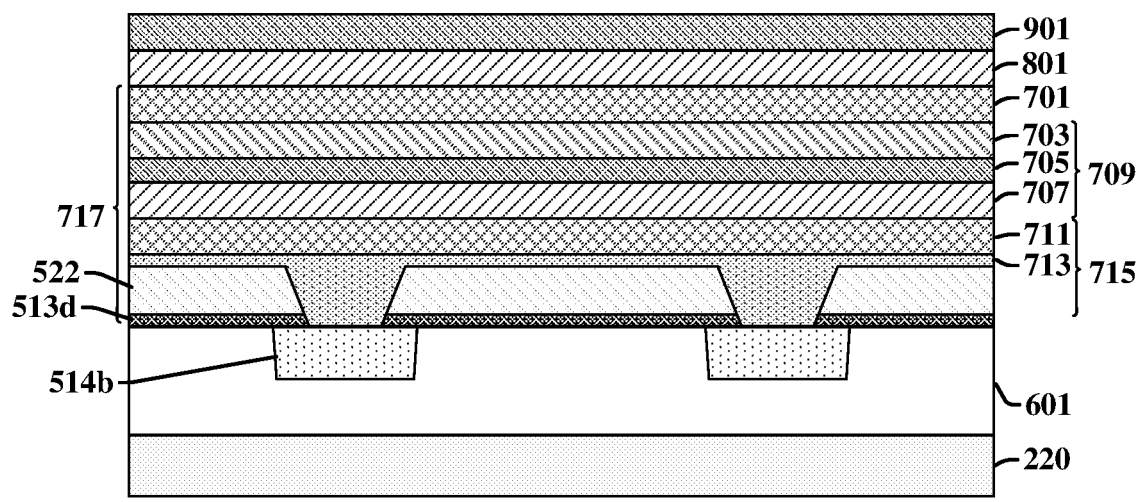

As shown in cross-sectional view 900 of FIG. 9, the ferromagnetic layer 801 may be partially oxidized to form a first dielectric layer 901. In some embodiments, the first dielectric layer 901 has a thickness between approximately 2 nm and approximately 40 nm. In some embodiments, the first dielectric layer 901 has a thickness between approximately 5 nm and approximately 20 nm. In some embodiments, the oxidation process reduces the ferromagnetic layer 801 to a thickness between approximately 5 nm and approximately 60 nm. In some embodiments, the oxidation process reduces the ferromagnetic layer 801 to a thickness between approximately 10 nm and approximately 30 nm. Any suitable oxidation process may be used. In some embodiments, the oxidation is accomplished by exposing the ferromagnetic layer 801 to oxygen. In some embodiments, the oxidation is accomplished by exposing the ferromagnetic layer 801 to a plasma that includes oxygen-containing ions or molecules. In some embodiments, the oxidation is accomplished by allowing the ferromagnetic layer 801 to scavenge oxygen from an oxide layer that is disposed over the ferromagnetic layer 801.

Figure 10:
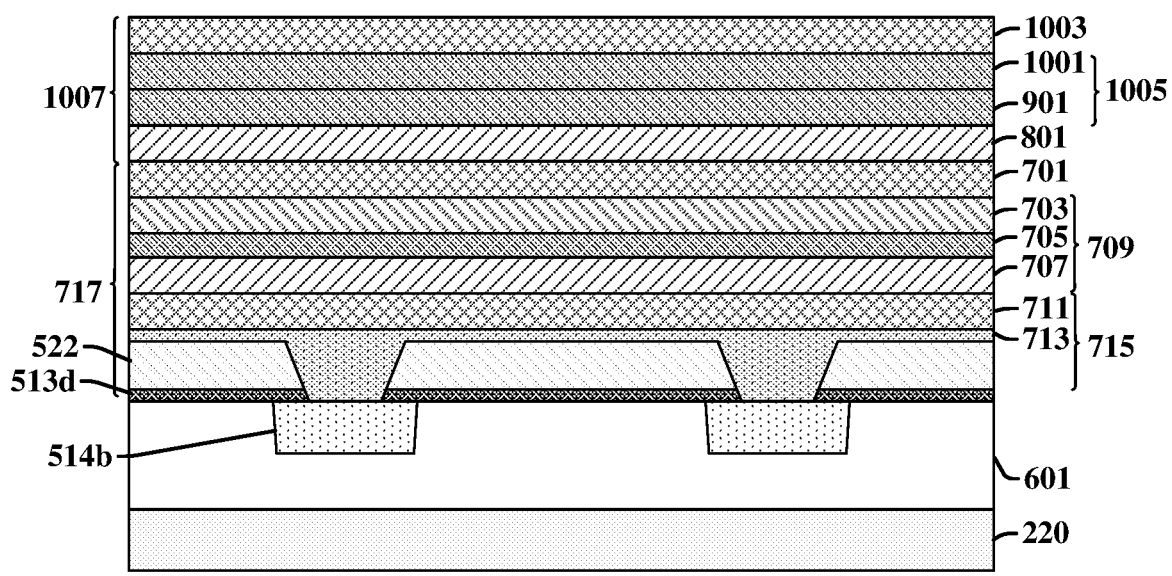

As shown in cross-sectional view 1000 of FIG. 10, additional layers may be deposited over the structure shown in cross-sectional view 900 of FIG. 9 to form a bipolar selector stack 1007. The bipolar selector stack 1007 may include the ferromagnetic layer 801, non-metal layers 1005, and a top electrode layer 1003. The non-metal layers 1005 may include the first dielectric layer 901 and a second dielectric layer 1001, wherein the second dielectric layer has a band gap energy distinct from a band gap energy of the first dielectric layer 901. In some embodiments, the second dielectric layer 1001 has a thickness between approximately 2 nm and approximately 40 nm. In some embodiments, the second dielectric layer 1001 has a thickness between approximately 5 nm and approximately 20 nm. In some embodiments, the top electrode layer 1003 has a thickness between approximately 5 nm and approximately 60 nm. In some embodiments, the top electrode layer 1003 has a thickness between approximately 10 nm and approximately 30 nm.

Figure 11:
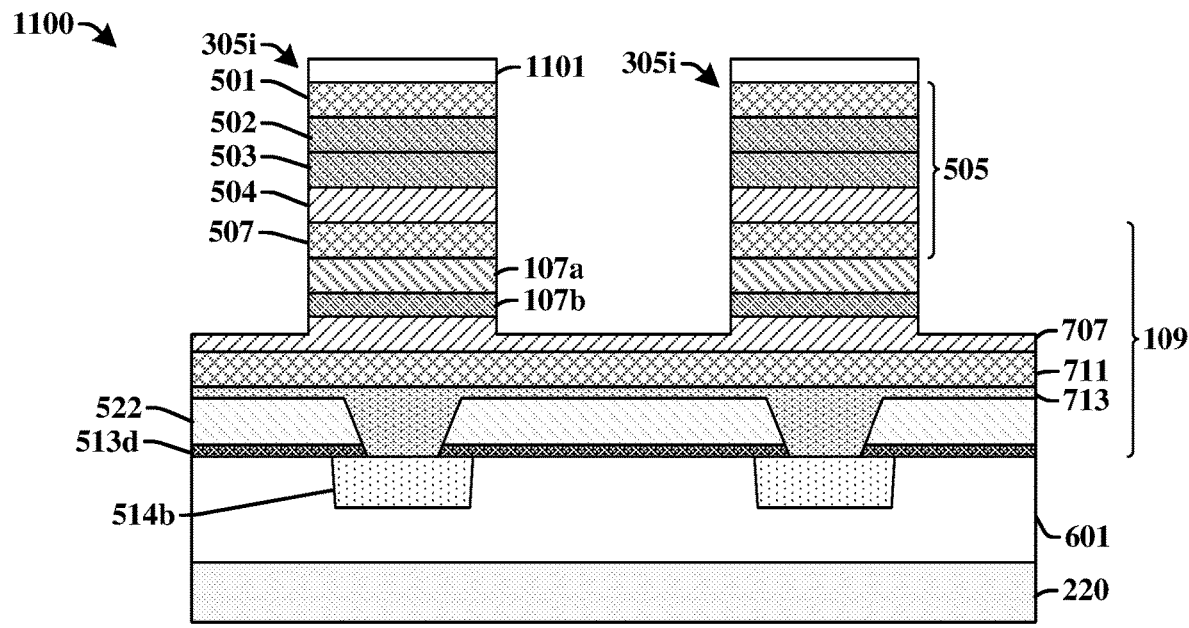

As shown in cross-sectional view 1100 of FIG. 11, a mask layer 1101 may be formed and the bipolar selector stack 1007 selectively etched according to the mask layer 1101 to define memory cells 305i. The mask layer 1101 may be silicon nitride, silicon carbide, or the like. Etching defines an access selector apparatus 505 from the bipolar selector stack 1007. Patterning to define the access selector apparatus 505 includes defining the top electrode 501 from the top electrode layer 1003, the second dielectric layer 502 from the second dielectric layer 1001, and the first dielectric layer 503 from the first dielectric layer 901. The access selector apparatus 505 also includes the first metal structure 509 that comprises a polarized magnetic layer 504 defined from the ferromagnetic layer 801. The first metal structure 509 may also be considered to include all or part of second electrode 507, which is defined from top electrode layer 701. Etching with the mask layer 1101 may further define portions of MTJ devices 109 including defining second electrode 507 from top electrode layer 701, and all or part of MTJs 107 from MTJ stack 709. The parts of the MTJs 107 formed from MTJ stack 709 by the etch of FIG. 11 may include the free layer 107a, the dielectric tunnel barrier 107b, and/or the pinned layer 107c.

Figure 12:
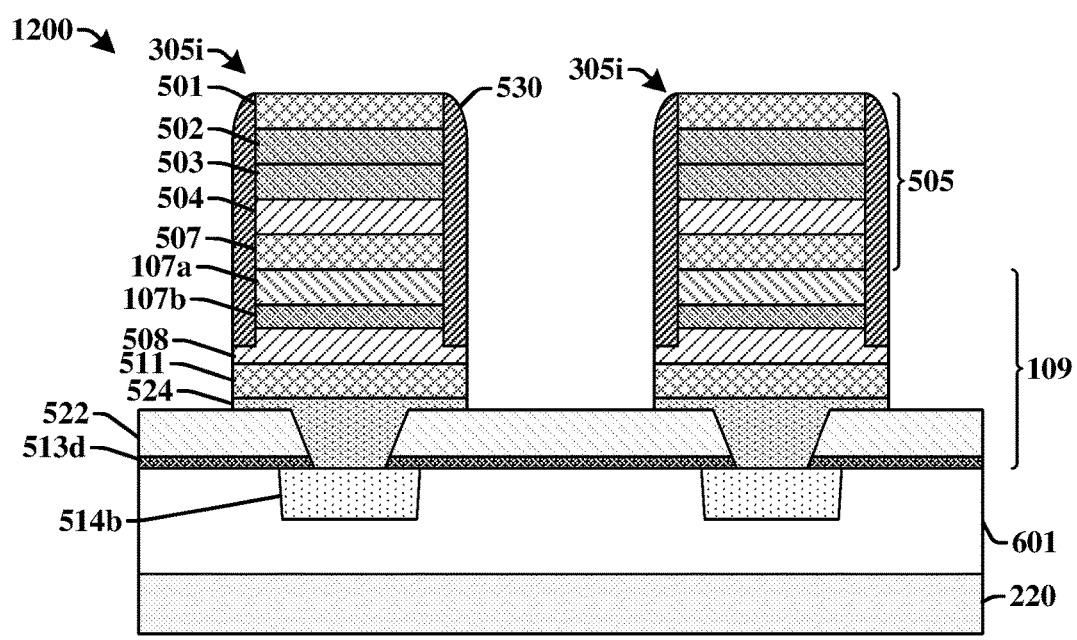

As shown in cross-sectional view 1200 of FIG. 12, sidewall spacers 530 are formed adjacent the memory cells 305i as shown in cross-sectional view 1100 of FIG. 11. Sidewall spacers 530 flank the access selector apparatus 505 and extend to flank portions of the MTJs 107 including at least the dielectric tunnel barriers 107b. As also shown in cross-sectional view 1200 of FIG. 12, sidewall spacers 530 provide a masking function for selective etching that completes the definition of MTJ devices 109 from MTJ stack 709. The selective etching defines first electrodes 511 from the bottom electrode layer 711 and bottom electrode vias 524 from the bottom electrode via layer 713. As a result, edges of first electrodes 511 may align with sidewall spacer 530. The etching may remove the mask layer 1101.

Figure 13:
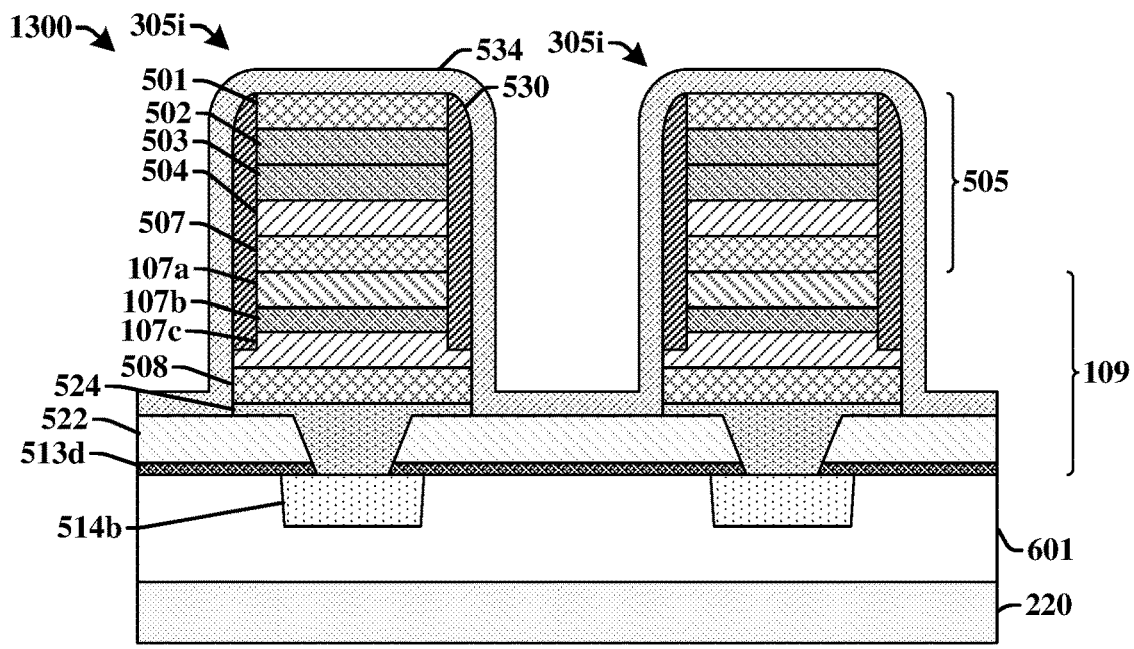

As shown in cross-sectional view 1300 of FIG. 13 an encapsulation layer 534 is formed over memory cells 305i and sidewall spacer 530. The encapsulation layer 534 flanks sides of both the MTJ device 109 and the access selector apparatus 505. As shown in cross-sectional view 1400 of FIG. 14, a fourth ILD layer 512d may be formed over the encapsulation layer 534. The fourth ILD layer 512d may be patterned to define openings that are subsequently filled with metal to define electrode vias 536 and interconnect wires 514c. The resulting structure may form a portion of the integrated chip 500 shown in FIG. 5.

In the example of integrated chip 500 the memory cells 305i are shown with a single set of sidewall spacers 530 and a single encapsulation layer 534. In various embodiments, additional sidewall spacers, additional encapsulations layers, and one or more capping layers may be used for such purposes as preventing cross-contamination between layers of bipolar selector stack 1007 and/or layers of MTJ device stack 717 during patterning, facilitating patterning of bipolar selector stack 1007 and/or MTJ device stack 717, and assuring that vias 536 land on top electrodes 501 without causing shorts.

Figure 15:
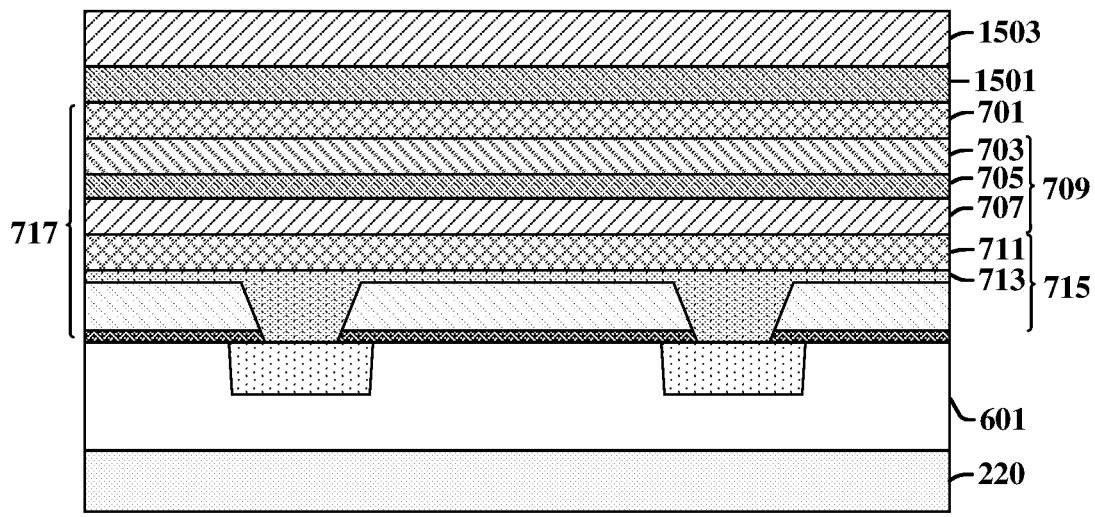
FIGS. 15-16 illustrate some other embodiments of a method of forming an integrated chip having memory cells comprising a magnetic tunnel junction (MTJ) device and an access selector apparatus having a polarized magnetic layer configured to substantially reduce a switching time for the MTJ device.
Figure 16:
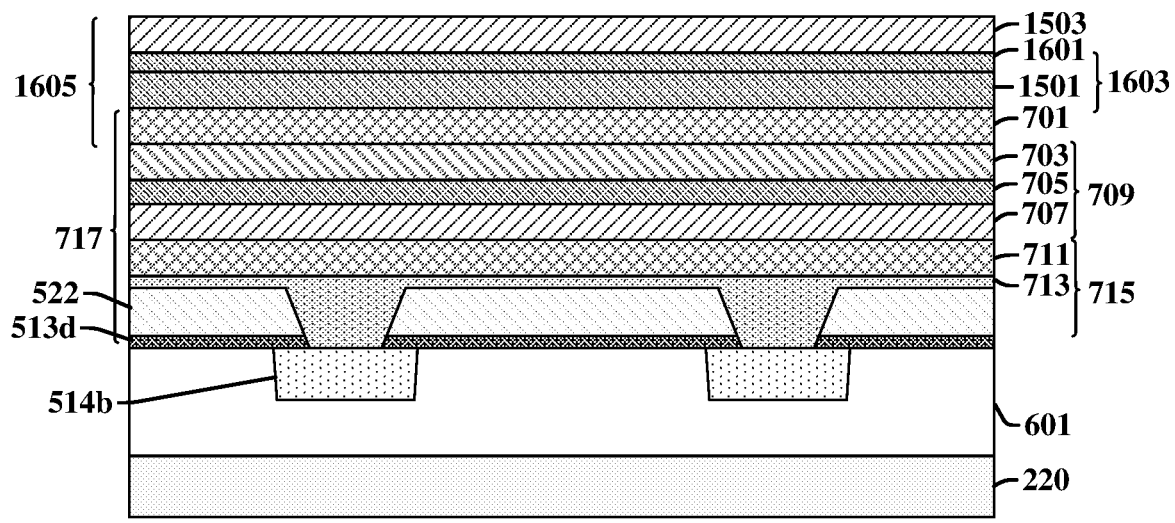

FIGS. 15-16 illustrate cross-sectional views 1500-1600 of some embodiments of another method of forming an integrated chip having an access selector apparatus comprising a bipolar selector that includes a polarized magnetic layer operative to reduce a write time for an associated MTJ device. As shown in cross-sectional view 1500 of FIG. 15, formation of the bipolar selector may begin with forming a third dielectric layer 1501 and a ferromagnetic layer 1503 over an MTJ device stack 717. The third dielectric layer 1501 comprises an oxide. As shown in cross-sectional view 1600 of FIG. 16, a fourth dielectric layer 1601 may then be formed by partially oxidizing the ferromagnetic layer 1503. The oxidation may occur by scavenging oxygen from the third dielectric layer 1501. In the resulting bipolar selector stack 1605, the top electrode layer 701 of the MTJ stack 709 may serve as the bottom electrode, the ferromagnetic layer 1503 may serve as the top electrode, and the third dielectric layer 1501 and the fourth dielectric layer 1601 may be the non-metal layers 1005 separating the top electrode from the bottom electrode.

Figure 17:
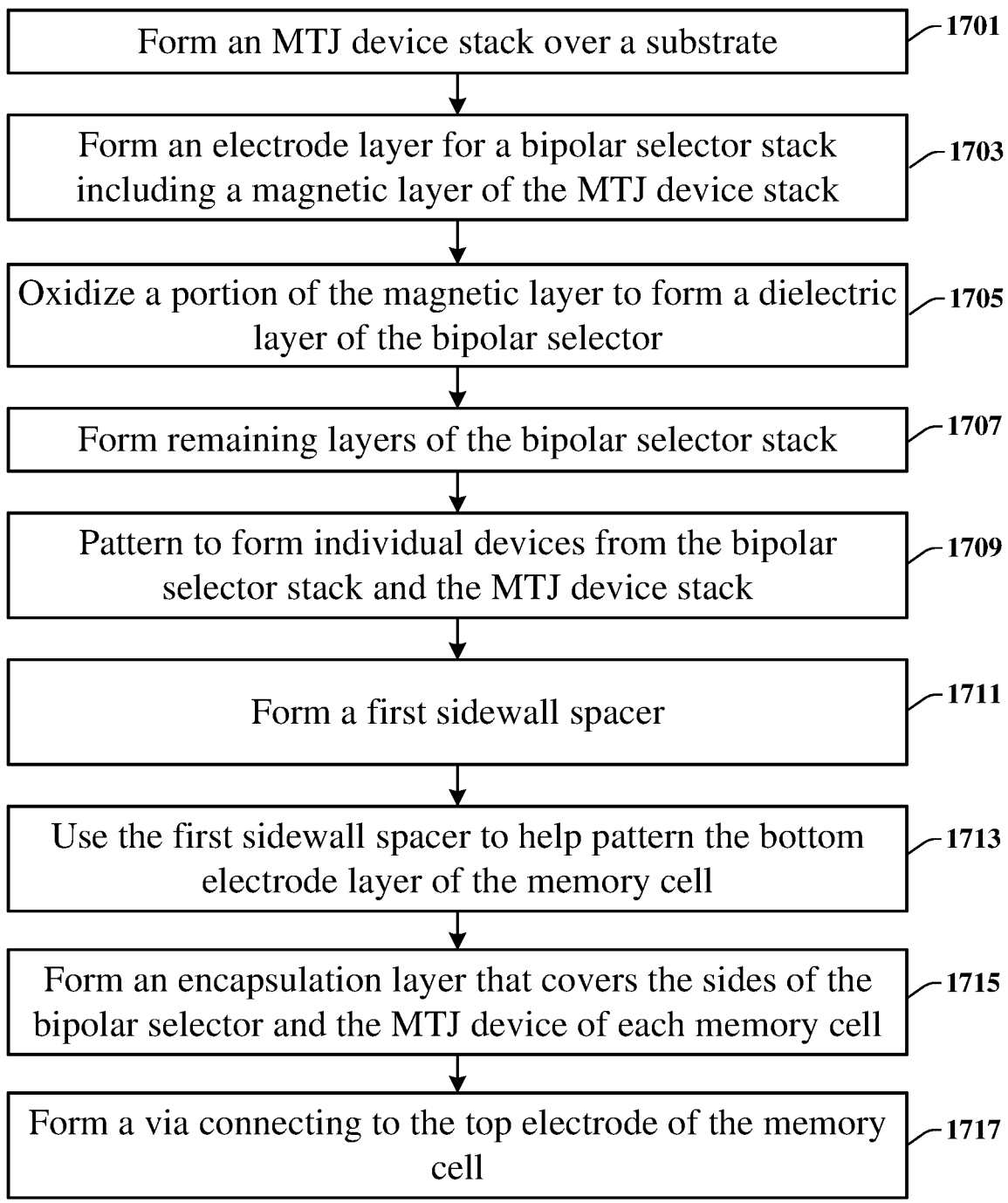
FIG. 17 provides a flow diagram for some embodiments of a method of forming an integrated chip having memory cells comprising a magnetic tunnel junction (MTJ) device and an access selector apparatus having a polarized magnetic layer configured to substantially reduce a switching time for the MTJ device.

FIG. 17 provides a flow diagram of some embodiments of a method 1700 of forming an integrated chip having a memory cell that include an MTJ device and an access selector apparatus, wherein the access selector apparatus comprises a polarized magnetic layer operative to reduce a write time for an associated memory cell. While the method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Act 1701 is forming an MTJ device stack above a substrate. The cross-sectional view 700 of FIG. 7 shows an embodiment corresponding to act 1701 in which the MTJ device stack 717 is formed over the substrate 220.

Act 1703 is forming an electrode layer for a bipolar selector stack including a magnetic layer. The cross-sectional view 800 of FIG. 8 shows an embodiment corresponding to act 1703 wherein the magnetic layer is the ferromagnetic layer 801. The cross-sectional view 1500 of FIG. 15 shows another example wherein the magnetic layer is the ferromagnetic layer 1503. The layers of the bipolar selector stack may be formed directly over the layers of the MTJ device stack 717 as shown in the cross-sectional views 800-1000 and 1500-1600 of FIGS. 8-10 and 15-16. In some alternative embodiments, the layers of the MTJ device stack 717 are formed over the layers of the bipolar selector. In other embodiments, the MTJ device stack and the access selector apparatus may have a different spatial relationship.

Act 1705 is oxidizing a portion of the magnetic layer to form a dielectric layer for a bipolar selector stack. The cross-sectional view 900 of FIG. 9 shows an example in which the first dielectric layer 901 has been formed by partially oxidizing the ferromagnetic layer 801. The cross-sectional view 1600 of FIG. 16 show another example in which the fourth dielectric layer 1601 has been formed by partially oxidizing the ferromagnetic layer 1503.

Act 1707 is forming any remaining layers of the bipolar selector stack. The cross-sectional view 1000 of FIG. 10 shows an example in which the bipolar selector stack 1007 is completed by forming the second dielectric layer 1001 and the top electrode layer 1003 over the first dielectric layer 901. The cross-sectional view 1600 of FIG. 16 show another example in which the bipolar selector stack 1007 may be complete upon oxidizing a portion of the ferromagnetic layer 1503 to form the fourth dielectric layer 1601.

Act 1709 is patterning to form individual devices from the bipolar selector stack and the MTJ device stack. The cross-sectional view 1100 of FIG. 11 shows an example in which patterning has defined the access selector apparatus 505 and partially defined the MTJ device 109 for each memory cell 305*i*.

Act 1711 is forming sidewall spacers adjacent to the individual devices formed by the patterning of act 1709. The cross-sectional view 1200 of FIG. 12 shows an example in which sidewall spacers 530 have been formed adjacent the access selector apparatus 505 and portions of the MTJ device 109 including the dielectric tunnel barrier 107*b* for each memory cell 305*i*.

Act 1713 is using the sidewall spacers formed by act 1711 to pattern a bottom electrode layer for the memory cells. The cross-sectional view 1200 of FIG. 12 shows an example in which the sidewall spacers 530 have been used to pattern the first electrode 511 and the bottom electrode via 524 for each memory cell 305*i*.

Act 1715 is forming an encapsulation layer that covers the sides of the bipolar selector and the MTJ device of each memory cell. The cross-sectional view 1300 of FIG. 13 shows an example in which the encapsulation layer 534 covers the sides of the access selector apparatus 505 and the MTJ device 109 of each memory cell 305*i*.

Figure 14:
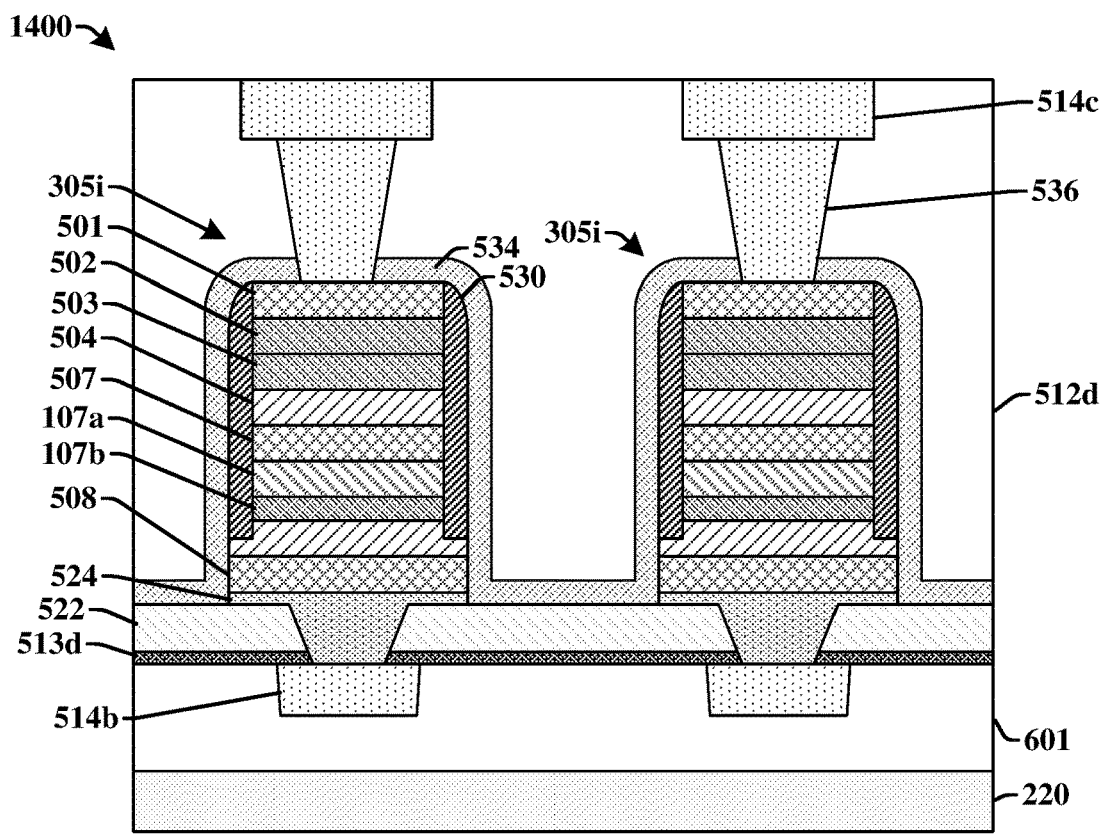

Act 1717 is forming a via connecting to the top electrode of the memory cell. The cross-sectional view 1400 of FIG. 14 shows an example in which the via 536 has been made to contact the top electrode 501 in each memory cell 305*i*.

Some aspects of the present teachings relate to an integrated chip that includes a magnetic tunnel junction (MTJ) device and an access selector apparatus. The device has a first electrode and a second electrode. The access selector apparatus includes a first metal structure and a second metal structure separated by one or more non-metallic layers. One of the first metal structure and the second metal structure is coupled to the second electrode. In accordance with the present teachings, the first metal structure of the access selector apparatus comprises a polarized ferromagnetic layer.

In some of these teachings, the first metal structure is an electrode for the access selector apparatus. In some of these teachings the access selector apparatus is a bipolar selector. In some of these teachings the one or more non-metallic layers include two insulators having different band gap energies. In some of these teachings one of the two insulators having different band gap energies is an oxide of a metal of the polarized ferromagnetic layer. In some of these teachings the MTJ and the access selector apparatus are formed by a stack of material layers. In some of these teachings one of the one or more non-metallic layers is an oxide of the polarized ferromagnetic layer. In some of these teachings the polarized ferromagnetic layer has in-plane polarization. In these teachings, the MTJ device may include a pinned layer having perpendicular magnetic polarization. In some of these teachings the first metal structure includes an electrode layer that is distinct from the polarized ferromagnetic layer. The MTJ device includes a free layer and a pinned layer. The polarized ferromagnetic layer produces a magnetic field that extends through the free layer. The magnetic field tilts a direction of polarization of the free layer of the MTJ device so as to reduce a switching time for the MTJ device Some aspects of the present teachings relate to an integrated chip having a magnetic tunnel junction (MTJ) device disposed within a dielectric structure over a substrate. The MTJ device include an MTJ disposed between a first MTJ electrode and a second MTJ electrode. The integrate chip also has a bipolar selector (BS) comprising a middle structure disposed between a first BS electrode and a second BS electrode. The second BS electrode is coupled to or integral with the first MTJ electrode. The middle structure is one or more layers of insulators and/or semiconductors. One of the first BS electrode and the second BS electrode includes a polarized magnetic layer.

In some of these teachings the polarized magnetic layer has in-plane polarization. In some of these teachings the first BS electrode provides the polarized magnetic layer. In some of these teachings the MTJ device includes a free layer and a pinned layer and the polarized magnetic layer has a magnetic field that is effective to reduce a number of precession cycles undergone by the free layer during switching of the MTJ device.

Some aspects of the present teachings relate to a method of forming an integrated chip. The method includes forming a magnetic tunnel junction (MTJ) device over a semiconductor substrate and forming a bipolar selector for the MTJ device. The MTJ device has an MTJ disposed between a first electrode and a second electrode. The bipolar selector includes a layer of ferromagnetic material with in-plane polarization over the semiconductor substrate and is coupled to the second electrode.

In some of these teachings the bipolar selector is formed directly over or under the MTJ device. In some of these teachings the layer of ferromagnetic material is configured to reduce a write voltage of the MTJ device. In some of these teachings the bipolar selector (BS) comprises one or more non-metal layers disposed between a first BS electrode and a second BS electrode. In some of these teachings the bipolar selector is formed in part by oxidizing a portion of the layer of ferromagnetic material to form one of the one or more non-metal layers.

Some aspects of the present teachings relate to a method of switching polarization of a free layer in a magnetic tunnel junction (MTJ) device. The method includes forming a magnetic tunnel junction (MTJ) device over a semiconductor substrate wherein the MTJ device has an MTJ disposed between a first electrode and a second electrode. The method also includes forming a bipolar selector having a layer of ferromagnetic material with in-plane polarization over the semiconductor substrate in a configuration such that the ferromagnetic material tilts a direction of polarization in the free layer away from a direction of current flow and thereby reduces a write time for the MTJ device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, the method comprising:
    forming a magnetic tunnel junction (MTJ) device over a semiconductor substrate, the MTJ device having an MTJ disposed between a first electrode and a second electrode, wherein the MTJ comprises a pinned layer, a free layer, and a tunnel barrier layer; and
    forming a metal-insulator-metal (MIM) bipolar selector for the MTJ device by a process that includes forming a first metal layer, a non-magnetic layer, and a second metal layer, wherein the non-magnetic layer is between the first metal layer and the second metal layer, and one of the first metal layer and the second metal layer is a ferromagnetic material layer; and
    providing the ferromagnetic material layer with fixed polarization;
    wherein the ferromagnetic material layer has a magnetic field that extends through the free layer.

2. The method of claim 1, wherein the MIM bipolar selector is formed directly over or under the MTJ device.

3. The method of claim 1, wherein the ferromagnetic material layer reduces a switching time for the MTJ device.

4. The method of claim 1, wherein the MTJ device is in a memory cell that depends on the MIM bipolar selector for access control.

5. The method of claim 1, wherein providing the ferromagnetic material layer with fixed polarization comprises providing the ferromagnetic material layer with in-plane magnetic polarization.

6. The method of claim 5, wherein the pinned layer has a polarization orthogonal to a polarization of the ferromagnetic material layer.

7. The method of claim 1, wherein forming the non-magnetic layer comprises oxidizing a portion of the ferromagnetic material layer.

8. The method of claim 7, wherein the non-magnetic layer includes an oxide of cobalt ($CoO_x$), an oxide of nickel ($NiO_x$), or an oxide of iron ($FeO_x$).

9. The method of claim 7, wherein forming the non-magnetic layer comprises allowing the ferromagnetic material layer to scavenge oxygen from an oxide layer that has been deposited over the ferromagnetic material layer.

10. The method of claim 1, wherein the non-magnetic layer is a first dielectric layer, forming the MIM bipolar selector comprises forming a second dielectric layer, and the second dielectric layer is between the first metal layer and the second metal layer.

11. A method of forming an integrated chip, comprising:
    forming a magnetic tunnel junction (MTJ) device comprising a pinned layer and a free layer separated by an insulating layer; and
    forming a bipolar selector for the MTJ device, wherein the bipolar selector includes an electrode comprising a layer of ferromagnetic material;
    providing the layer of ferromagnetic material with in-plane magnetic polarization; and
    providing the free layer with perpendicular magnetic polarization.

12. The method of claim 11, wherein forming the MTJ device and forming the bipolar selector comprises forming a stack of material layers and etching the stack of material layers to define the MTJ device and the bipolar selector.

13. The method of claim 11, wherein the layer of ferromagnetic material causes a magnetic moment in the free layer to be tilted away from the perpendicular magnetic polarization.

14. The method of claim 11, wherein the bipolar selector reduces leakage currents through the MTJ device.

15. The method of claim 11, wherein forming the bipolar selector comprises:
 depositing the layer of ferromagnetic material; and
 oxidizing a portion of the layer of ferromagnetic material to form a dielectric layer.

16. The method of claim 11, wherein forming the bipolar selector comprises:
 depositing an oxide layer;
 depositing the layer of ferromagnetic material; and
 heating so that a portion of the layer of ferromagnetic material is oxidized and forms a dielectric layer.

17. A method, comprising:
 providing a memory array comprising memory cells that include a magnetic tunnel junction (MTJ) comprising a pinned layer and a free layer separated by an insulating layer;
 providing bipolar selectors that are connected in series with the memory cells; and
 providing a bit line decoder and a word line decoder operative to select individual memory cells in the memory array;
 wherein the bipolar selectors comprise a first dielectric layer and a layer of polarized ferromagnetic material;
 the bipolar selectors are effective for reducing leak currents through non-selected memory cells; and
 the layer of polarized ferromagnetic material produces a magnetic field that tilts a polarization of the free layer and thereby reduces switching times for the memory cells.

18. The method of claim 17, wherein the layer of polarized ferromagnetic material has fixed in-plane magnetic polarization.

19. The method of claim 17, wherein:
 the bipolar selectors comprise a second dielectric layer; and
 the first dielectric layer and the second dielectric layer have different band gap energies.

20. The method of claim 17, wherein the bipolar selectors comprise a semiconductor layer.

* * * * *